US008264202B2

(12) United States Patent
Sahu et al.

(10) Patent No.: US 8,264,202 B2
(45) Date of Patent: Sep. 11, 2012

(54) METHOD AND APPARATUS FOR DETERMINING STATE OF CHARGE OF A BATTERY USING AN OPEN-CIRCUIT VOLTAGE

(75) Inventors: Saroj Kumar Sahu, Mountain House, CA (US); Ali Firouzi, Los Altos, CA (US)

(73) Assignee: Deeya Energy, Inc., Fremont, CA (US)

( * ) Notice: Subject to any disclaimer, the term of this patent is extended or adjusted under 35 U.S.C. 154(b) by 412 days.

(21) Appl. No.: 12/576,242

(22) Filed: Oct. 9, 2009

(65) Prior Publication Data

US 2010/0090651 A1 Apr. 15, 2010

Related U.S. Application Data

(60) Provisional application No. 61/104,583, filed on Oct. 10, 2008.

(51) Int. Cl.
*H01M 10/44* (2006.01)
*H01M 10/46* (2006.01)

(52) U.S. Cl. ...................................... 320/132

(58) Field of Classification Search ............ 320/132, 320/149; 324/426, 427, 430, 433
See application file for complete search history.

(56) References Cited

U.S. PATENT DOCUMENTS

| 3,540,934 A | 11/1970 | Boeke |
| 3,996,064 A | 12/1976 | Thaller |
| 4,133,941 A | 1/1979 | Sheibley |
| 4,159,366 A | 6/1979 | Thaller |
| 4,309,372 A | 1/1982 | Sheibley |
| 4,312,735 A | 1/1982 | Grimes et al. |
| 4,414,090 A | 11/1983 | D'Agostino et al. |
| 4,454,649 A | 6/1984 | Jalan et al. |
| 4,468,441 A | 8/1984 | D'Agostino et al. |
| 4,485,154 A | 11/1984 | Remick et al. |
| 4,496,637 A | 1/1985 | Shimada et al. |
| 4,543,302 A | 9/1985 | Gahn et al. |
| 4,732,827 A | 3/1988 | Kaneko et al. |
| 4,784,924 A | 11/1988 | Savinell et al. |
| 4,814,241 A | 3/1989 | Nagashima et al. |
| 4,828,666 A | 5/1989 | Iizuka et al. |
| 4,874,483 A | 10/1989 | Wakabayashi et al. |

(Continued)

FOREIGN PATENT DOCUMENTS

DE 102006007206 10/2006

(Continued)

OTHER PUBLICATIONS

PCT International Search Report and the Written Opinion mailed Nov. 30, 2009, in related International Application No. PCT/US2009/060279.

(Continued)

*Primary Examiner* — Edward Tso
(74) *Attorney, Agent, or Firm* — Haynes and Boone, LLP

(57) ABSTRACT

A method and apparatus for determining the state of charge (SOC) of a battery is discussed. The method involves measuring the terminal voltage across the battery and the current flowing through the battery at a plurality of different times and fitting a line equation with a slope and an intercept to the terminal voltage and current data. The open-circuit voltage (OCV) is calculated from the intercept of the linear equation and the SOC is determined from the OCV by reference to a lookup table.

19 Claims, 11 Drawing Sheets

U.S. PATENT DOCUMENTS

| | | | |
|---|---|---|---|
| 4,882,241 | A | 11/1989 | Heinzel |
| 4,894,294 | A | 1/1990 | Ashizawa et al. |
| 4,929,325 | A | 5/1990 | Bowen et al. |
| 4,945,019 | A | 7/1990 | Bowen et al. |
| 4,948,681 | A | 8/1990 | Zagrodnik et al. |
| 4,956,244 | A | 9/1990 | Shimizu et al. |
| 5,061,578 | A | 10/1991 | Kozuma et al. |
| 5,119,011 | A | 6/1992 | Lambert |
| 5,162,168 | A | 11/1992 | Downing et al. |
| 5,188,911 | A | 2/1993 | Downing et al. |
| 5,258,241 | A | 11/1993 | Ledjeff et al. |
| 5,366,824 | A | 11/1994 | Nozaki et al. |
| 5,366,827 | A | 11/1994 | Belanger et al. |
| 5,648,184 | A | 7/1997 | Inoue et al. |
| 5,656,390 | A | 8/1997 | Kageyama et al. |
| 5,665,212 | A | 9/1997 | Zhong et al. |
| 5,759,711 | A | 6/1998 | Miyabayashi et al. |
| 5,847,566 | A | 12/1998 | Marritt et al. |
| 5,851,694 | A | 12/1998 | Miyabayashi et al. |
| 5,949,219 | A | 9/1999 | Weiss |
| 6,005,183 | A | 12/1999 | Akai et al. |
| 6,037,749 | A | 3/2000 | Parsonage |
| 6,040,075 | A | 3/2000 | Adcock et al. |
| 6,086,643 | A | 7/2000 | Clark et al. |
| 6,236,582 | B1 | 5/2001 | Jalaleddine |
| 6,461,772 | B1 | 10/2002 | Miyake et al. |
| 6,475,661 | B1 | 11/2002 | Pellegri et al. |
| 6,507,169 | B1 | 1/2003 | Holtom et al. |
| 6,509,119 | B1 | 1/2003 | Kobayashi et al. |
| 6,524,452 | B1 | 2/2003 | Clark et al. |
| 6,555,267 | B1 | 4/2003 | Broman et al. |
| 6,562,514 | B1 | 5/2003 | Kazacos et al. |
| 6,692,862 | B1 | 2/2004 | Zocchi |
| 6,759,158 | B2 | 7/2004 | Tomazic |
| 6,761,945 | B1 | 7/2004 | Adachi et al. |
| 6,764,789 | B1 | 7/2004 | Sekiguchi et al. |
| 6,905,797 | B2 | 6/2005 | Broman et al. |
| 6,940,255 | B2 | 9/2005 | Loch |
| 6,986,966 | B2 | 1/2006 | Clarke et al. |
| 7,046,531 | B2 | 5/2006 | Zocchi et al. |
| 7,061,205 | B2 | 6/2006 | Shigematsu et al. |
| 7,078,123 | B2 | 7/2006 | Kazacos et al. |
| 7,181,183 | B1 | 2/2007 | Hennessy et al. |
| 7,184,903 | B1 | 2/2007 | Williams et al. |
| 7,199,550 | B2 | 4/2007 | Tsutsui et al. |
| 7,220,515 | B2 | 5/2007 | Ito et al. |
| 7,227,275 | B2 | 6/2007 | Hennessy et al. |
| 7,557,584 | B2* | 7/2009 | Murakami et al. ............ 324/429 |
| 2003/0008203 | A1 | 1/2003 | Winter |
| 2004/0001996 | A1* | 1/2004 | Sugimoto ................... 324/434 |
| 2004/0070370 | A1 | 4/2004 | Emura |
| 2004/0168818 | A1 | 9/2004 | Layden et al. |
| 2004/0170893 | A1 | 9/2004 | Nakaishi et al. |
| 2004/0202915 | A1 | 10/2004 | Nakaishi et al. |
| 2004/0241544 | A1 | 12/2004 | Nakaishi et al. |
| 2005/0074653 | A1 | 4/2005 | Broman et al. |
| 2005/0156431 | A1 | 7/2005 | Hennessy |
| 2005/0156432 | A1 | 7/2005 | Hennessy |
| 2005/0158615 | A1 | 7/2005 | Samuel et al. |
| 2005/0164075 | A1 | 7/2005 | Kumamoto et al. |
| 2005/0181273 | A1 | 8/2005 | Deguchi et al. |
| 2005/0260473 | A1 | 11/2005 | Wang |
| 2006/0014054 | A1 | 1/2006 | Sugawara |
| 2006/0092588 | A1 | 5/2006 | Realmuto et al. |
| 2006/0232277 | A1* | 10/2006 | Murakami et al. ............ 324/433 |
| 2007/0072067 | A1 | 3/2007 | Symons et al. |
| 2007/0080666 | A1 | 4/2007 | Ritter et al. |
| 2007/0090844 | A1* | 4/2007 | Klang ........................... 324/426 |
| 2007/0111089 | A1 | 5/2007 | Swan |
| 2008/0193828 | A1 | 8/2008 | Sahu |
| 2009/0218984 | A1 | 9/2009 | Parakulam |
| 2010/0003586 | A1 | 1/2010 | Sahu |
| 2010/0090651 | A1 | 4/2010 | Sahu |
| 2010/0092757 | A1 | 4/2010 | Nair |
| 2010/0092807 | A1 | 4/2010 | Sahu |
| 2010/0092813 | A1 | 4/2010 | Sahu |
| 2010/0092843 | A1 | 4/2010 | Conway |
| 2010/0094468 | A1 | 4/2010 | Sahu |
| 2010/0136455 | A1 | 6/2010 | Winter |
| 2010/0143781 | A1 | 6/2010 | Keshavarz |

FOREIGN PATENT DOCUMENTS

| | | |
|---|---|---|
| EP | 0 696 831 | 2/1996 |
| EP | 1 462 813 | 9/2004 |
| JP | 60047373 | 3/1985 |
| JP | 60070672 | 4/1985 |
| JP | 60115174 | 6/1985 |
| JP | 1060967 | 3/1989 |
| JP | 1320776 | 12/1989 |
| JP | 2027667 | 1/1990 |
| JP | 2027668 | 1/1990 |
| JP | 3017963 | 1/1991 |
| JP | 8007913 | 1/1996 |
| JP | 10012260 | 1/1998 |
| JP | 10208766 | 8/1998 |
| JP | 11329474 | 11/1999 |
| JP | 2000058099 | 2/2000 |
| JP | 2000200619 | 7/2000 |
| JP | 2002015762 | 1/2002 |
| JP | 2002175822 | 6/2002 |
| JP | 2002289233 | 10/2002 |
| JP | 2002367661 | 12/2002 |
| JP | 2003173812 | 6/2003 |
| JP | 2005142056 | 6/2005 |
| JP | 2005228622 | 8/2005 |
| JP | 2005228633 | 8/2005 |
| JP | 2005322447 | 11/2005 |
| JP | 2006107988 | 4/2006 |
| JP | 2006114360 | 4/2006 |
| JP | 2006147306 | 6/2006 |
| JP | 2006147376 | 6/2006 |
| JP | 2006313691 | 11/2006 |
| JP | 2006351346 | 12/2006 |
| JP | 2007087829 | 4/2007 |
| WO | 8905528 | 6/1989 |
| WO | 9003666 | 4/1990 |
| WO | 0017991 | 3/2000 |
| WO | 03005476 | 1/2003 |
| WO | 2004079849 | 9/2004 |
| WO | 2006135958 | 12/2006 |

OTHER PUBLICATIONS

Office Action for U.S. Appl. No. 11/674,101 mailed Apr. 9, 2010.
Search Report for PCT Application No. PCT/US2008/53601.
Written Opinion for PCT Application No. PCT/US2008/53601.
IPRP for PCT Application No. PCT/US2008/53601.
Search Report for PCT Application No. PCT/US2009/001303.
Search Report for PCT Application No. PCT/US2009/049285.

* cited by examiner

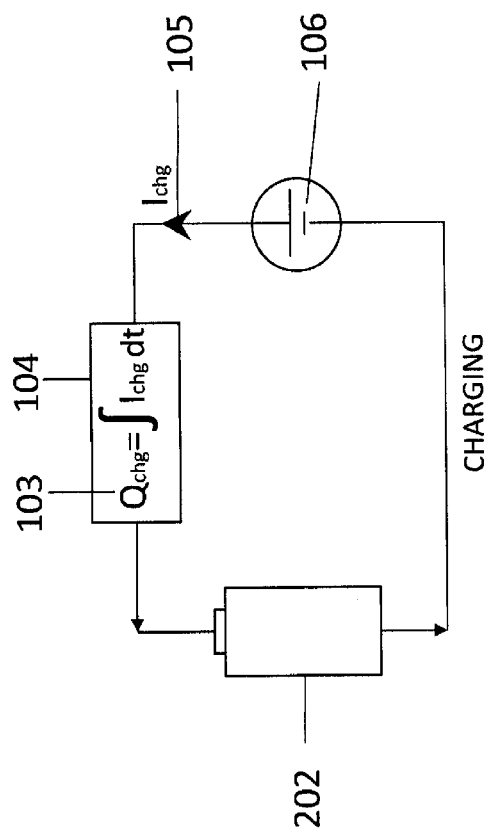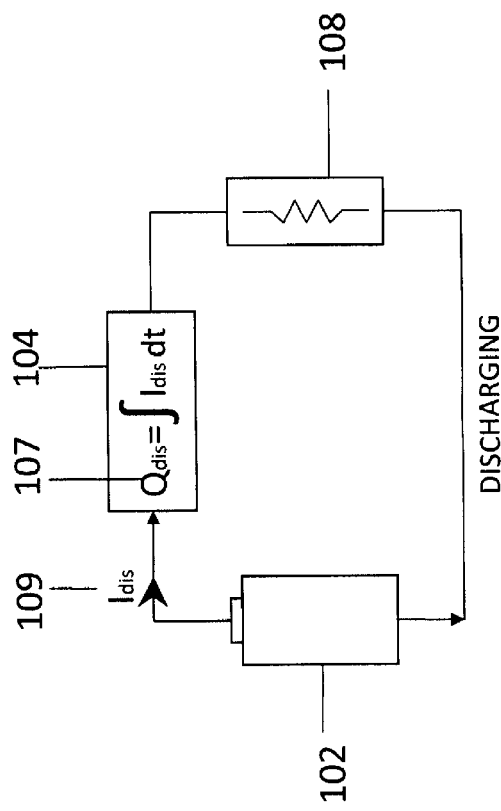
FIG. 1a
FIG. 1b $OCV = V_{cell} - I_{chg} * ESR$

CHARGING $OCV = V_{cell} + I_{dis} * ESR$

DISCHARGING

216

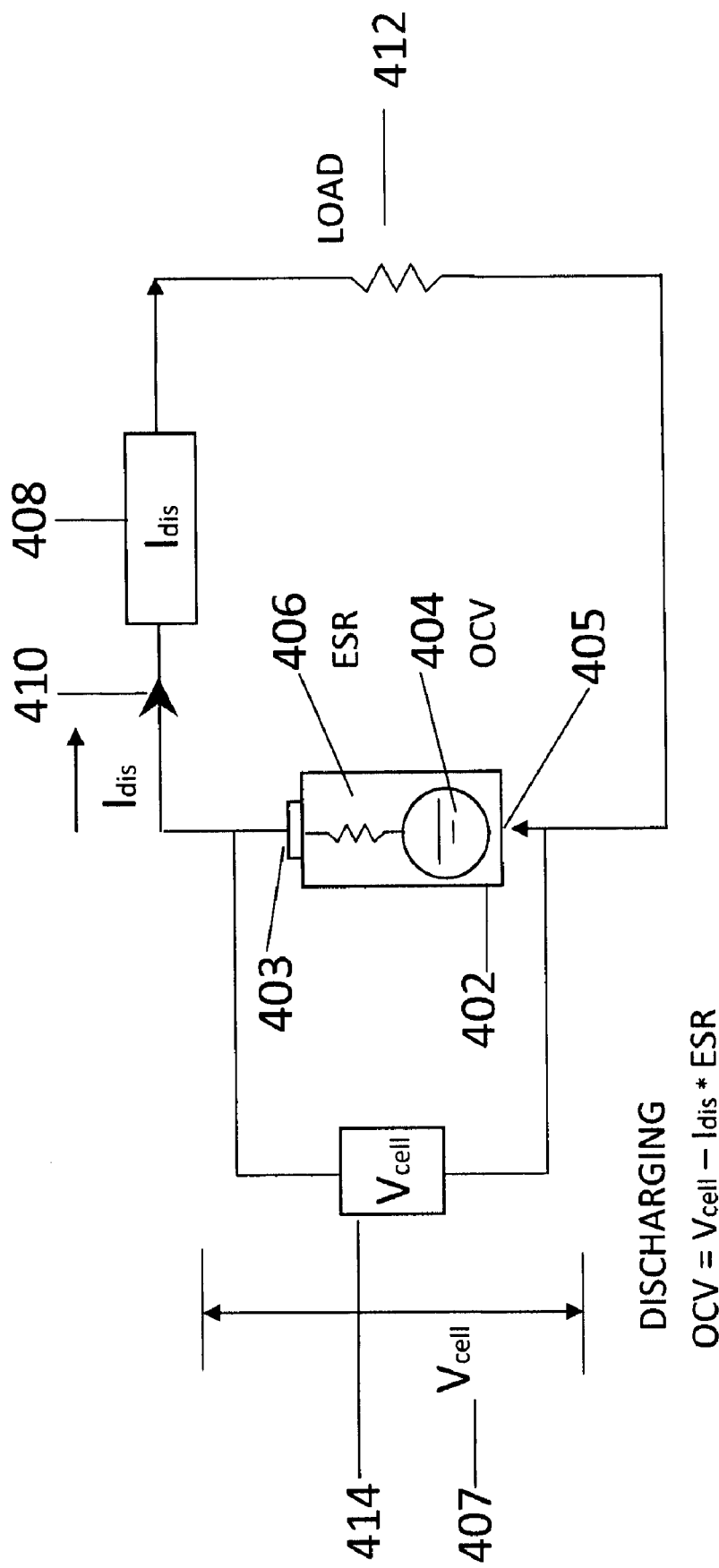

METHOD AND APPARATUS FOR DETERMINING STATE OF CHARGE OF A BATTERY USING AN OPEN-CIRCUIT VOLTAGE

CROSS-REFERENCE TO RELATED APPLICATIONS

The present application claims benefit under 35 U.S.C. §119(e) of U.S. Provisional Application No. 61/104,583 filed on Oct. 10, 2008, entitled "Determination of State of Charge of a Battery," the content of which is hereby incorporated by reference in its entirety.

BACKGROUND

1. Technical Field

This invention relates to battery systems, and more specifically, the determination of the charge status of a flow battery system.

2. Discussion of Related Art

The state of charge (SOC) of a battery at any stage (charging or discharging) is a highly desirable parameter. It provides, during a charging state, information on how long the battery will take to fully charge, and also provides an input to a sophisticated charging algorithm that allows better control of a charging sequence. During discharge, the SOC provides information regarding the remaining battery lifetime. In mission critical applications, the SOC information can be used to allocate the remaining charge between critical and non-critical loads.

Therefore, there is a need to accurately determine the SOC of a battery.

SUMMARY

A method and apparatus for determining the state of charge (SOC) of a battery is discussed. The method involves measuring the terminal voltage across the battery and the current flowing through the battery at a plurality of different times and fitting a line equation with a slope and an intercept to the terminal voltage and current data. The open circuit voltage (OCV) is calculated from the intercept of the linear equation and the SOC is determined form the OCV by reference to a lookup table.

These and other embodiments of the invention are further described below with respect to the following figures.

BRIEF DESCRIPTION OF THE DRAWINGS

In order to more fully understand the present invention, reference is made to the accompanying drawings, with the understanding that these drawings are not intended to limit the scope of the invention.

FIGS. 1a-b illustrate methods of estimating the charge status of a battery.

FIG. 4a illustrates a schematic diagram of a battery system during a discharging state consistent with some embodiments of the present invention.

Figure 2A:
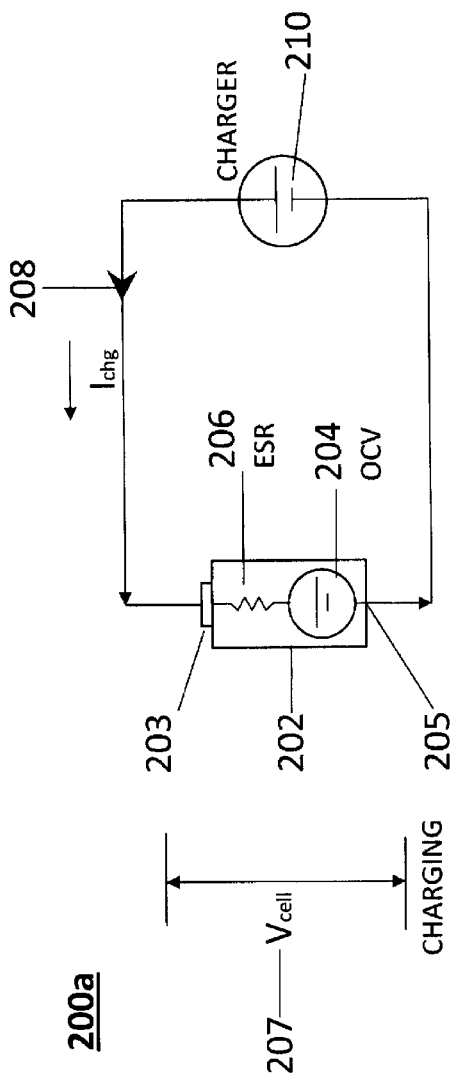
FIGS. 2a-c illustrate another method of estimating the charging status of a battery.

In the figures, elements having the same designation have the same or similar functions. The figures are illustrative only and relative sizes and distances depicted in the figures are for convenience of illustration only and have no further meaning.

DETAILED DESCRIPTION OF THE INVENTION

In the following description, for the purposes of explanation, specific details are set forth in order to provide a thorough understanding of the embodiments of the invention. However, it will be apparent that the invention may be practiced without these specific details.

Embodiments of the present invention provide techniques for determining the state of charge of a battery. Some embodiments determine the state of charge based upon measured battery current and voltage values.

Determining the state of charge (SOC) of a battery in a battery system allows for better control of both charging of the battery and allocation of the battery charge to various loads that may be coupled to the battery. A battery includes any charge storage device, including flow batteries, static batteries, or other chemical, mechanical, or electrical charge storage device. Methods and techniques that are currently employed to determine the SOC of a battery include (1) Coulomb counting, (2) indirect open-circuit voltage (OCV) measurement, and (3) zero-load OCV measurement. Each of these methods has its own set of advantages and disadvantages.

FIG. 1a illustrates a circuit diagram of a battery system 100a during a charging state where the Coulomb counting method is employed to determine the SOC. Battery system 100a includes battery 102 that is electrically coupled in series with a current integrator 104. A current integrator 104 performs a time integration of an electric current, measuring the total electric charge. In the charging state, as shown in FIG. 1a, an external voltage supply 106 is electrically coupled across the serial combination of the battery 102 and current integrator 104. The external voltage supply can be any source of voltage, including photovoltaic panels, wind-driven generators, and other chemical or mechanical devices for generating an electric potential. While charging, current integrator 104 integrates the charging current ($I_{chg}$) 105 over time to determine the charge ($Q_{chg}$) 103 deposited into battery 102.

FIG. 1b illustrates battery system 100b during a discharging stage. As shown in FIG. 1b, a load resistance 108 is electrically coupled across the serial combination of battery 102 and current integrator 104. A load resistance includes any electrical load (e.g., a resistor, a motor, or an electronic device). During the discharging stage, discharge current ($I_{dis}$) 109 flows from battery 102 through external load 108. Current integrator 104 continues to integrate the current, in this case discharge current ($I_{dis}$) 109, and thereby calculates the charge on battery 102 by subtracting the charge ($Q_{dis}$) leaving battery 102 from the charge placed on battery 102 during the charging state illustrated in FIG. 1a. Because the charge is counted at all times (by integrating both during charging and discharging), the net charge ($Q_{chg}-Q_{dis}$) corresponds to the charge remaining on battery 102, which is the relevant SOC information. However, integrator 104 cannot take into account any Coulombic inefficiency resulting from a parasitic reaction, such as hydrogen (H) or oxygen (O) generation, or self discharge which may occur.

The problems typically associated with Coulomb counting include accumulation error and Coulombic inefficiency. Accumulation error is the measurement error that is summed over many cycles. As a result of the accumulation error, the net charge on battery 102 is reset periodically. This reset is typically accomplished either at a fully charged or a fully discharged state, although waiting for such an event to occur in practical applications is not desirable.

Coulombic inefficiency refers to the charge that is lost in the battery by parasitic reactions. Generally, there are many parasitic reactions that occur in the battery, including self-discharge and electrode memory, electrode degradation, and non-reduction-oxidation (non-redox) reactions. These parasitic reactions result in charge that is lost to the battery, but not included in the Coulomb counting technique. This lost charge results in an inaccurate measure of the SOC by the Coulomb counting technique. Additionally, Coulomb counting methods are dependent on the measurement bandwidth, and for fast, varying loads, the counting is usually not very accurate.

Figure 2B:
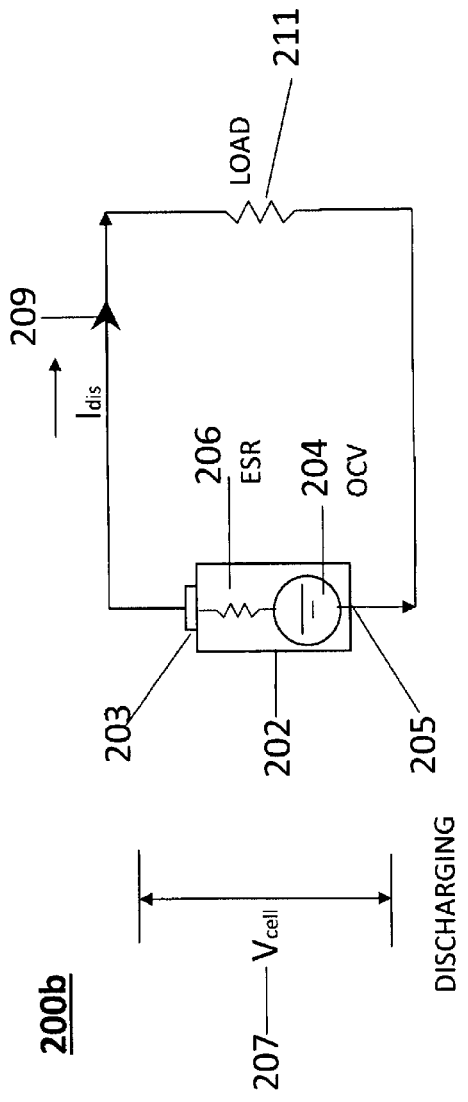
Figure 2C:
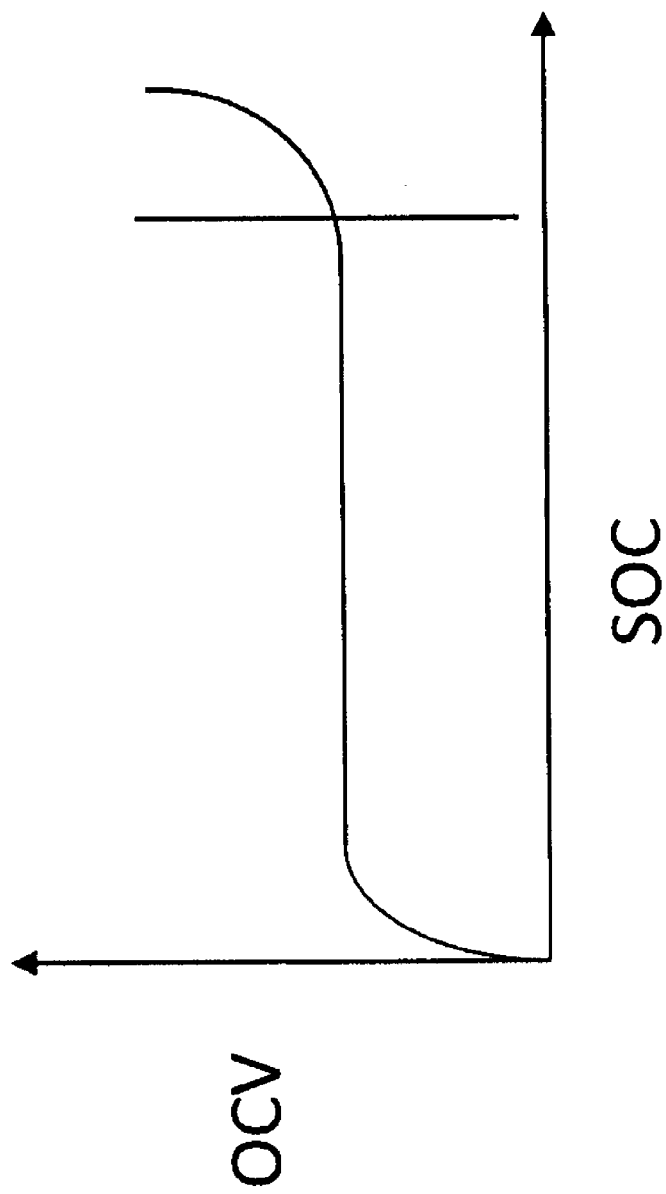

FIGS. 2a-c illustrate a battery system 200a and 200b that employs the indirect OCV measurement method to determine the SOC. Battery system 200a and 200b includes a battery 202 where a terminal voltage ($V_{cell}$) 207 is measured across terminals 203 and 205 of battery 202. Battery 202 is internally modeled as an OCV supply 204 and an equivalent series resistance (ESR) 206 electrically coupled in series between terminals 203 and 205. During the charging process, for example in a battery system 200a as shown in FIG. 2a, a battery charger 210 is electrically coupled across terminals 203 and 205. A charging current ($I_{chg}$) 208 flows from charger 210 to battery 202. Applying Kirchhoff's Voltage Law results in the following equation for the OCV:

$$OCV=V_{cell}-I_{chg}*ESR \quad (1)$$

Because the terminal voltage ($V_{cell}$) 207 and charging current ($I_{chg}$) 208 can be measured and the ESR 206 of the battery is assumed to be a known constant parameter characteristic of the battery 202, the OCV supply 204 can be calculated during charging of battery 202.

FIG. 2b illustrates a circuit diagram 200b where battery 202 is discharging. During discharge, battery 202 is electrically coupled across an external load resistance (Load) 211. Again applying Kirchhoff's Voltage Law, the following equation for the open-circuit voltage is obtained.

$$OCV=V_{cell}+I_{dis}*ESR \quad (2)$$

Again, because the terminal voltage ($V_{cell}$) 207 and discharge current ($I_{dis}$)) 209 can be measured and the parameter ESR 206 is assumed to be a known constant characteristic of battery 202, the OCV supply 204 can be calculated during discharge of battery 202.

FIG. 2c illustrates a correlation plot 216 of OCV vs. SOC corresponding to battery 202 (not shown in figure). Although OCV and SOC plots can be theoretically calculated from known reduction-oxidation (redox) potentials with the help of the Nernst Equation, the solution pH and other kinetic factors modify the relationship considerably. Therefore, this plot is typically developed from laboratory measurements under controlled conditions typical of the battery chemistry. The OCV during the charging and discharging process can be computed from equations (1) and (2), respectively, and the corresponding SOC information can be determined from the correlation plot 216 corresponding to battery 202 that is shown in FIG. 2c.

The indirect OCV measurement method assumes that the ESR of the battery is reasonably well known. However, the ESR of a battery changes over the life of the battery, and may also be a function of temperature and other ambient conditions in addition to the SOC. Therefore, the assumption that the indirectly measured OCV voltage depends solely on the SOC results in an inaccurate estimation of the true OCV and thus the SOC. For example, in a lead acid battery, the ESR changes as the plate thickness and electrolyte concentrations change during charge and discharge, in addition to depending on the SOC.

Figure 3A:
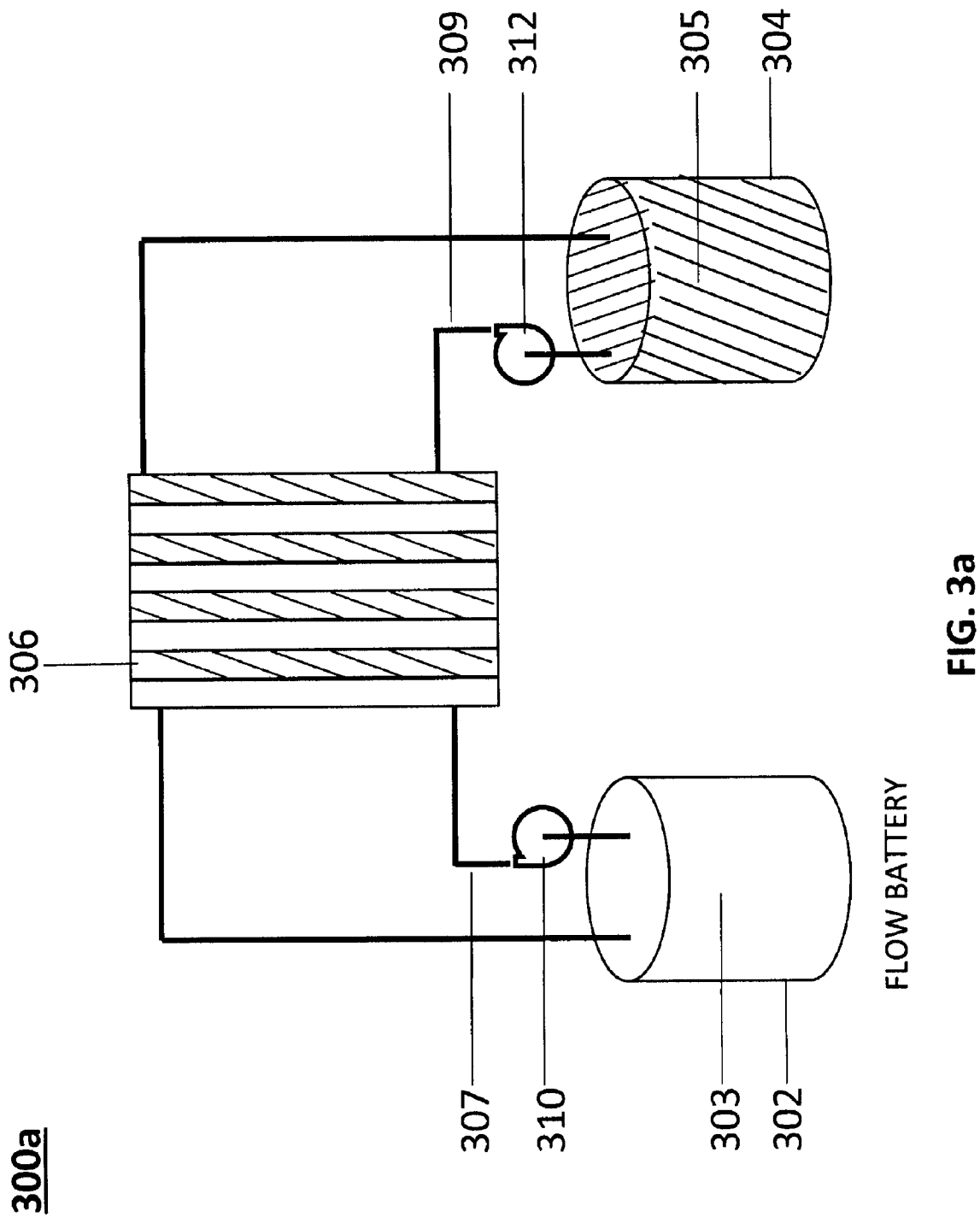
FIGS. 3a-b illustrate another method of estimating the charging status of a battery.
Figure 3B:
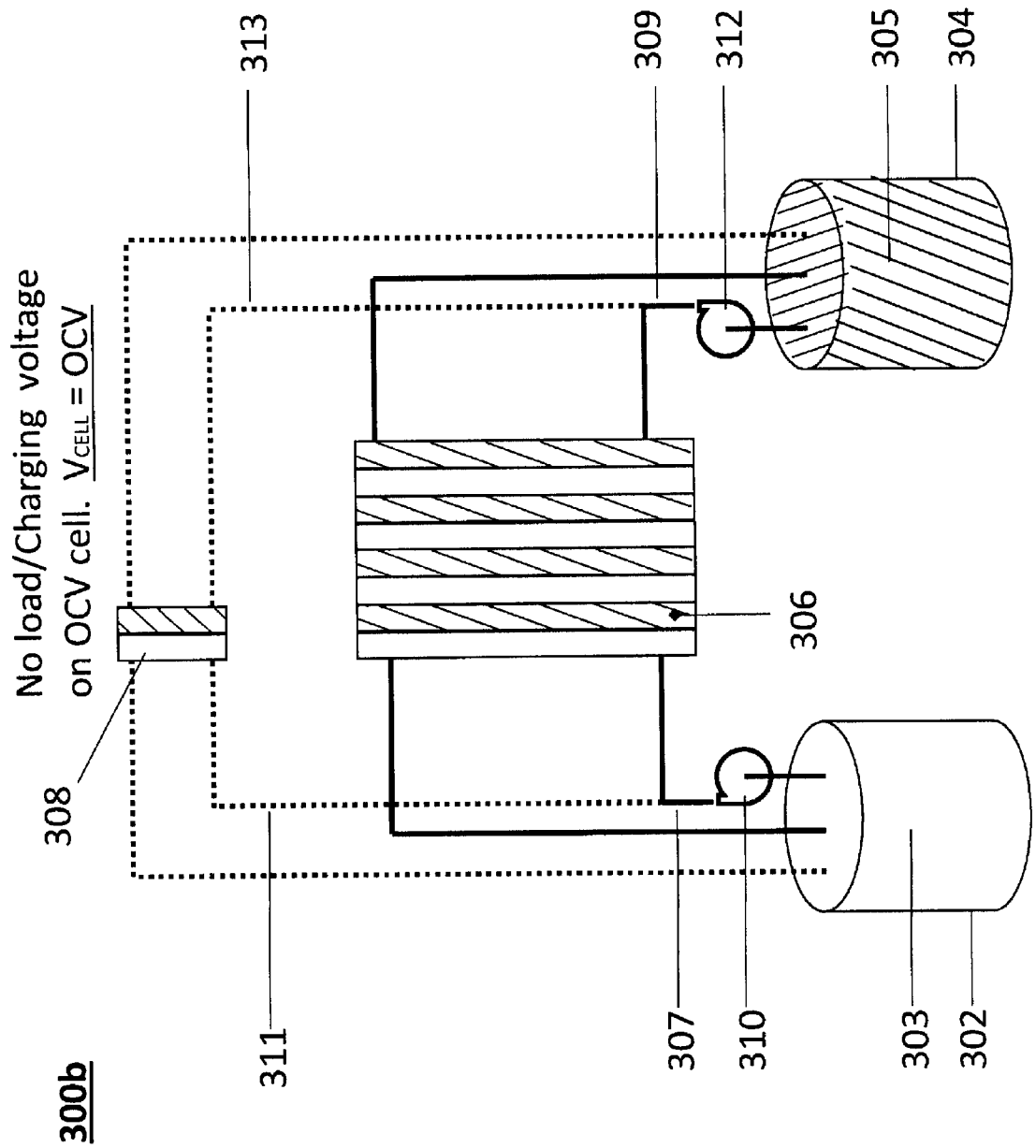

FIGS. 3a and 3b illustrate another method of determining the SOC of a battery system: zero-load OCV determination. FIG. 3a illustrates a flow battery system 300a. As shown in FIG. 3a, battery system 300a includes storage tanks 302 and 304 for storing anolyte 303 and catholyte 305, respectively, and a cell stack 306. Anolyte 303 and catholyte 305 are distributed through cell stack 306 by distribution systems 307 and 309, respectively. In some embodiments, distribution systems 307 and 309 can include pumps 310 and 312, respectively, which are used to distribute anolyte 303 and catholyte 305 through cell stack 306.

FIG. 3b illustrates the flow battery system 300b employing the zero-load OCV measurement method to determine the SOC. As shown in FIG. 3b, an OCV cell 308 is electrically coupled in parallel to cell stack 306 by distribution systems 311 and 313, respectively. In some embodiments, pumps 310 and 312 may be used to distribute anolyte 303 and catholyte 305 through both cell stack 306 and OCV cell 308. Therefore, anolyte 303 and catholyte 305 flows through each of the cells in cell stack 306 and also OCV cell 308, in parallel. If it is assumed that the OCV of a flow cell depends only on the state of anolyte 303 and catholyte 305, then the OCV of each cell is identical. Therefore, the OCV for each of the cells in cell stack 306 can be determined by measuring the open-load voltage across OCV cell 308 when no load is applied to that cell. The SOC is then determined from an OCV vs. SOC correlation plot similar to the plot discussed above in FIG. 2c. The zero-load OCV measurement method, however, requires extra cells and plumbing, in addition to a more complex system integration. Also, measuring the OCV with this method is prone to error in flow battery systems, because the electrolytes experience a shunt current that modifies the observed voltages.

FIG. 4a illustrates a battery system 400a during a discharging stage consistent with some embodiments of the present invention. Battery system 400a includes a battery 402 electrically coupled in series with a current sensor 408. As shown in FIG. 4a, in discharge mode battery system 400a is electrically coupled to an external load resistance 412. Battery 402 is modeled by an internal equivalent series resistance (ESR) 406 electrically coupled in series with an open-circuit voltage (OCV) supply 404.

Figure 4B:
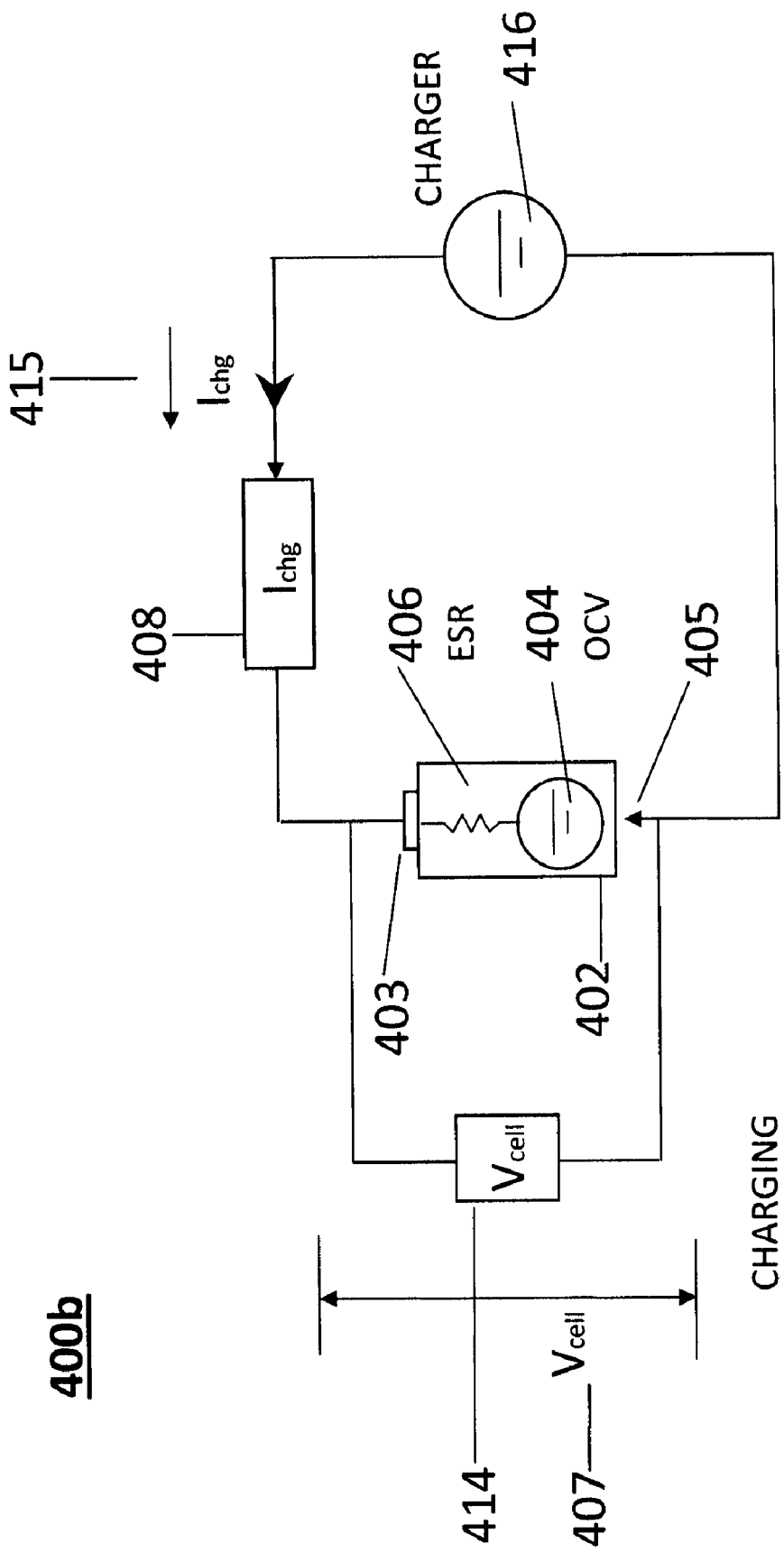
FIG. 4b illustrates a schematic diagram of a battery system during a charging state consistent with some embodiments of the present invention.
Figure 4C:
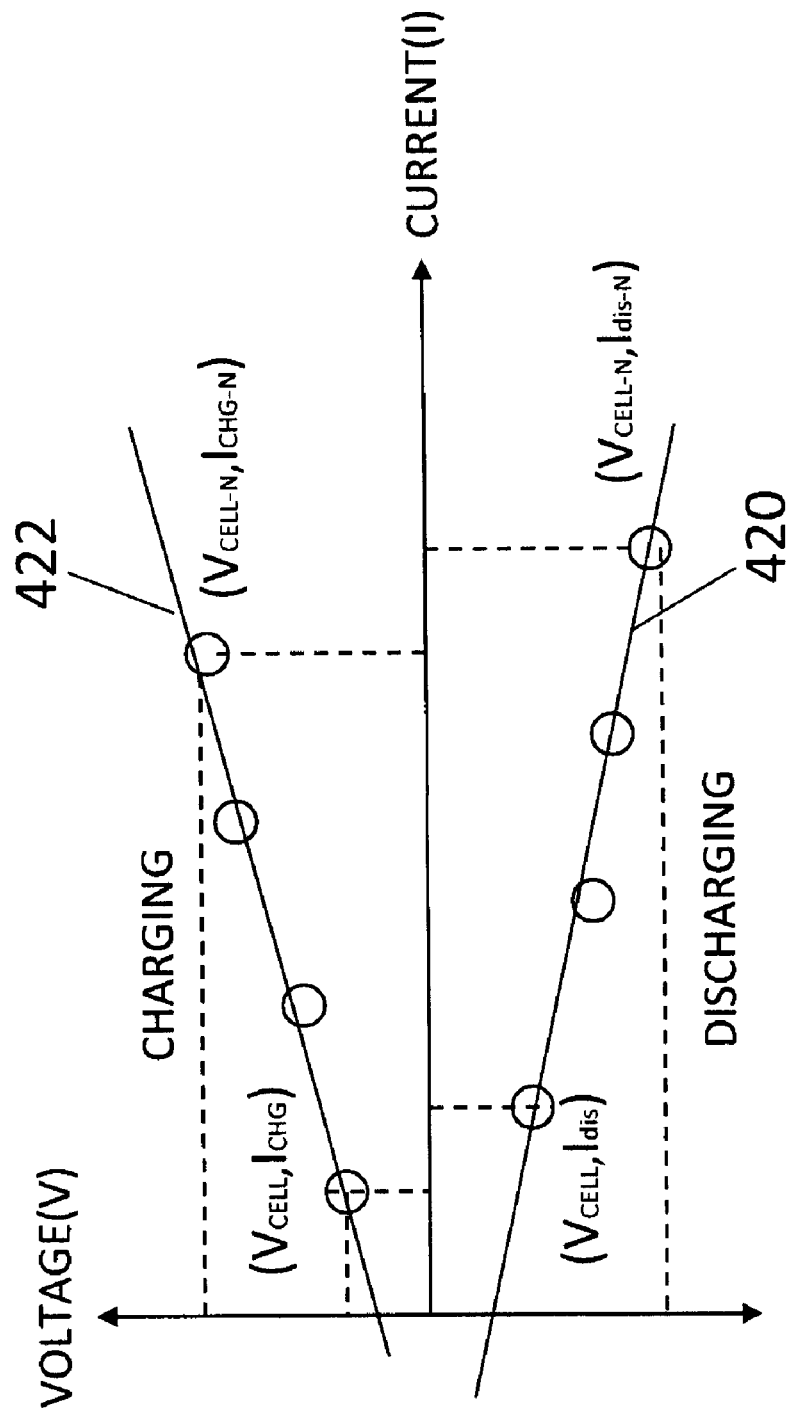
FIG. 4c illustrates a voltage vs. current plot consistent with some embodiments of the present invention.
Figure 4D:
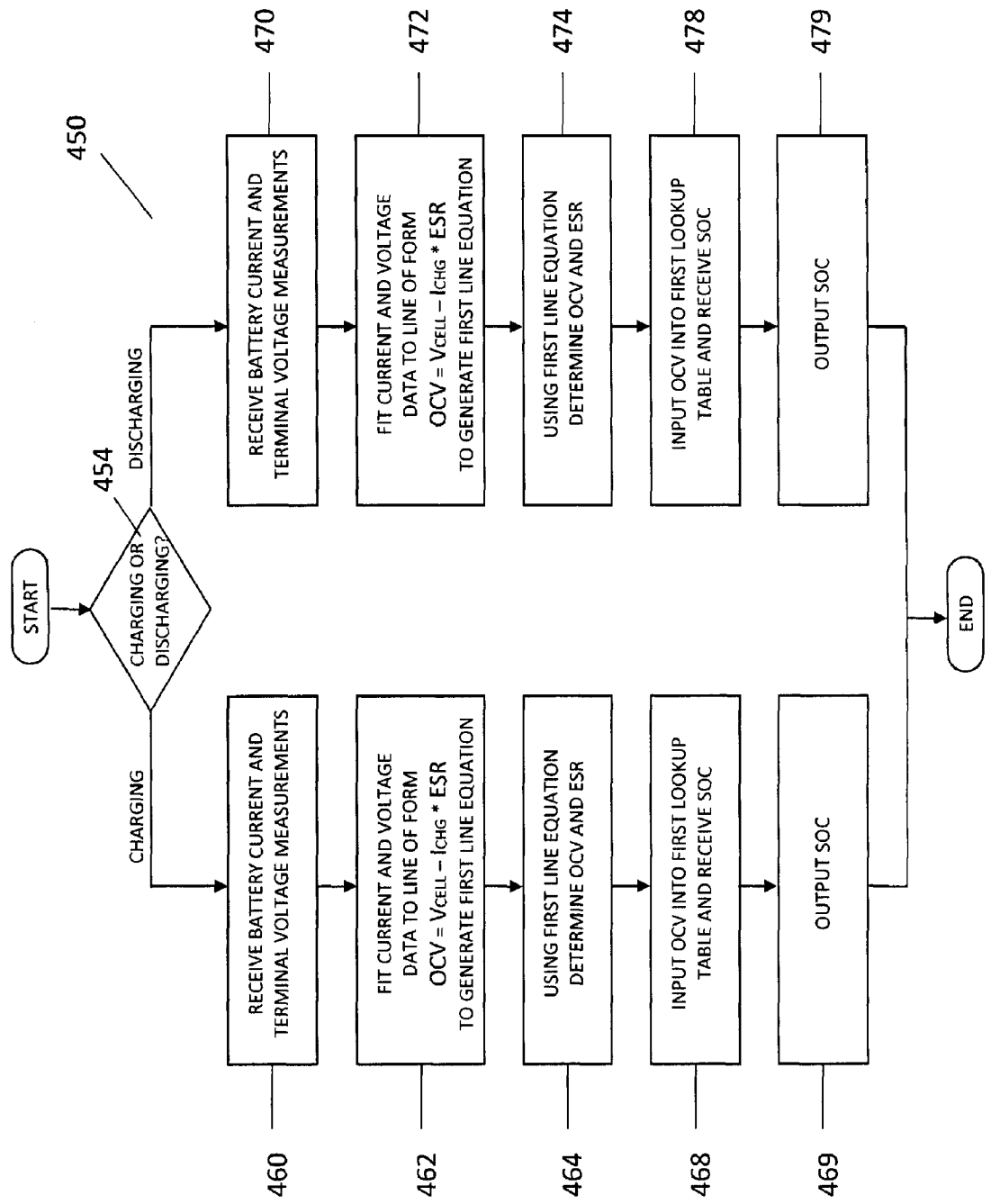
FIG. 4d is a simplified flow chart depicting a method for determining the state of charge of a battery according to some embodiments of the present invention.
Figure 4E:
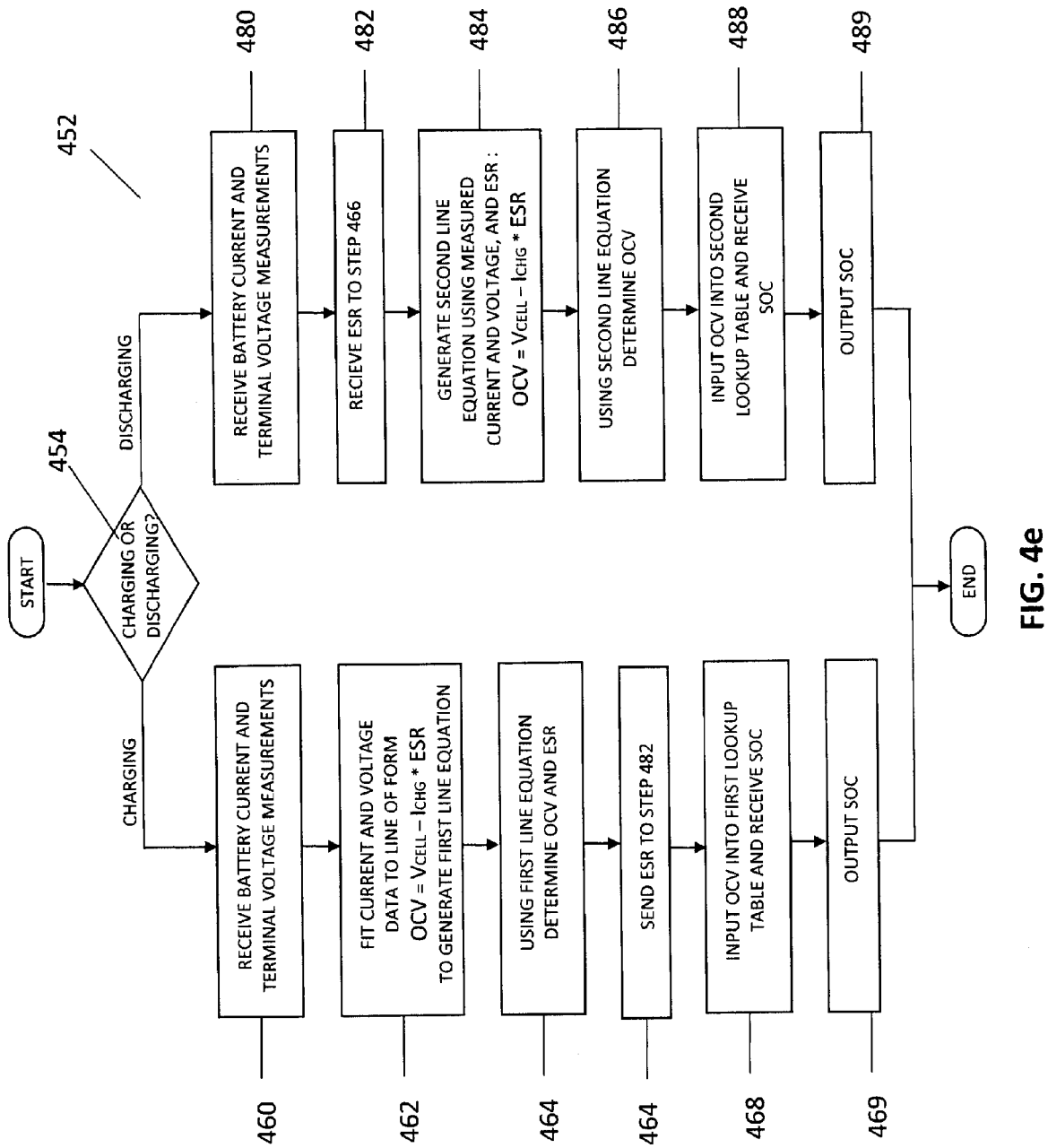
FIG. 4e is a simplified flow chart depicting a method for determining the state of charge of a battery according to some embodiments of the present invention.

FIGS. 4d and 4e illustrate flow charts 450 and 452, each of which depicts a method for determining the state of charge (SOC) of a battery according to some embodiments of the present invention. The methods depicted in FIGS. 4d and 4e may be performed by software (e.g., code, program, and instructions) executed by a processor, in hardware, or combinations thereof. The software may be stored on a computer-readable storage medium. The methods depicted in FIGS. 4d and 4e are not intended to limit the scope of the invention as recited in the claims.

As depicted in FIGS. 4d and 4e, when the battery is charging or discharging (Step 454), current flow and the battery terminal voltage are measured (Steps 460, 470, and 480). Referring back to FIG. 4a, a voltage across positive and negative terminals 403 and 405, respectively, is a terminal voltage ($V_{cell}$) 407. A voltage sensor 414 is electrically coupled in parallel to a battery 402 across terminals 403 and 405 to measure the terminal voltage ($V_{cell}$) 407. During the discharging process, a discharge current ($I_{dis}$) 410 flows from the battery 402 to an external load resistance 412. The discharge current ($I_{dis}$) 410 is measured by a current sensor 408. Applying Kirchhoff's Voltage Law results in the following equation for the terminal voltage ($V_{cell}$) 407:

$$V\text{cell} = OCV - I_{dis} * ESR \qquad (3)$$

In some embodiments, the current sensor 408 and voltage sensor 414 may be electrically coupled to a microprocessor or a computer system (not shown in figure) and may be configured by the microprocessor or computer system (not shown in figure) to take a plurality of current and voltage measurements, at either regular or random time intervals, as is shown for example in Table 1.

TABLE 1

| Time | $t_1$ | $t_2$ | ... | $t_n$ |
|---|---|---|---|---|
| Terminal Voltage | $V_{cell\_1}$ | $V_{cell\_2}$ | ... | $V_{cell\_n}$ |
| Current | $I_{dis\_1}$ | $I_{dis\_2}$ | ... | $I_{dis\_n}$ |

FIG. 4b illustrates battery system 400b during a charging stage consistent with some embodiments of the present invention. Battery system 400b includes battery 402 electrically coupled in series with current sensor 408 with voltage sensor 414 electrically coupled across terminals 403 and 405 of battery 402. As shown in FIG. 4b, battery system 400b is electrically coupled across an external charge voltage (charger) 416. The voltage across the positive and negative terminals 403 and 405, respectively, is the terminal voltage ($V_{cell}$) 407, which is measured by voltage sensor 414. During the charging process, the charge current ($I_{chg}$) 415, which is measured by current sensor 408, flows from charger 416 to battery 402. Applying Kirchhoff's Voltage Law results in the following equation for the terminal voltage ($V_{cell}$) 407:

$$V_{cell} = OCV + I_{chg} * ESR \qquad (4)$$

As described above, current sensor 408 and voltage sensor 414 may be electrically coupled to microprocessor or a computer system (not shown in figure) to take a plurality of current and voltage measurements, at either regular or random time intervals, as shown for example in Table 2.

TABLE 2

| Time | $t_1$ | $t_2$ | ... | $t_n$ |
|---|---|---|---|---|
| Terminal Voltage | $V_{cell\_1}$ | $V_{cell\_2}$ | ... | $V_{cell\_n}$ |
| Current | $I_{chg\_1}$ | $I_{chg\_2}$ | ... | $I_{chg\_n}$ |

As depicted in FIGS. 4d and 4e, the current and voltage measurements are fit to a line (Steps 462 and 472). FIG. 4c illustrates a plot 424 of the voltage and current measurements taken by voltage sensor 414 and current sensor 408 during the charging and discharging stages. As shown in FIG. 4c, voltage is plotted along a vertical axis and current along a horizontal axis. For a time $t_n$, the voltage and current measured are plotted in the plot 424. Those of ordinary skill in the art will appreciate that alternative embodiments, for example plotting voltage along a horizontal axis and current along a vertical axis, are possible. During the discharging stage, a linear equation for line 420 may be obtained by interpolating the voltage and current measurements (Step 472) taken during the discharging stage (Table 1). Various linear interpolation and linear regression techniques may be employed to obtain the equation of the line 420. Linear interpolation and linear regression techniques include, for example, ordinary least squares, generalized least squares, least absolute deviations, and the like. Similarly, during the charging stage, a linear equation for line 422 may be obtained by interpolating the voltage and current measurements (Step 462) taken during the charging stage (Table 2). In a current-voltage (I-V) graph as shown in FIG. 4c, the slope of the lines 420, 422 is the ESR while the y-intercept (on the voltage axis) is the OCV of the system at the current SOC.

Figure 5:
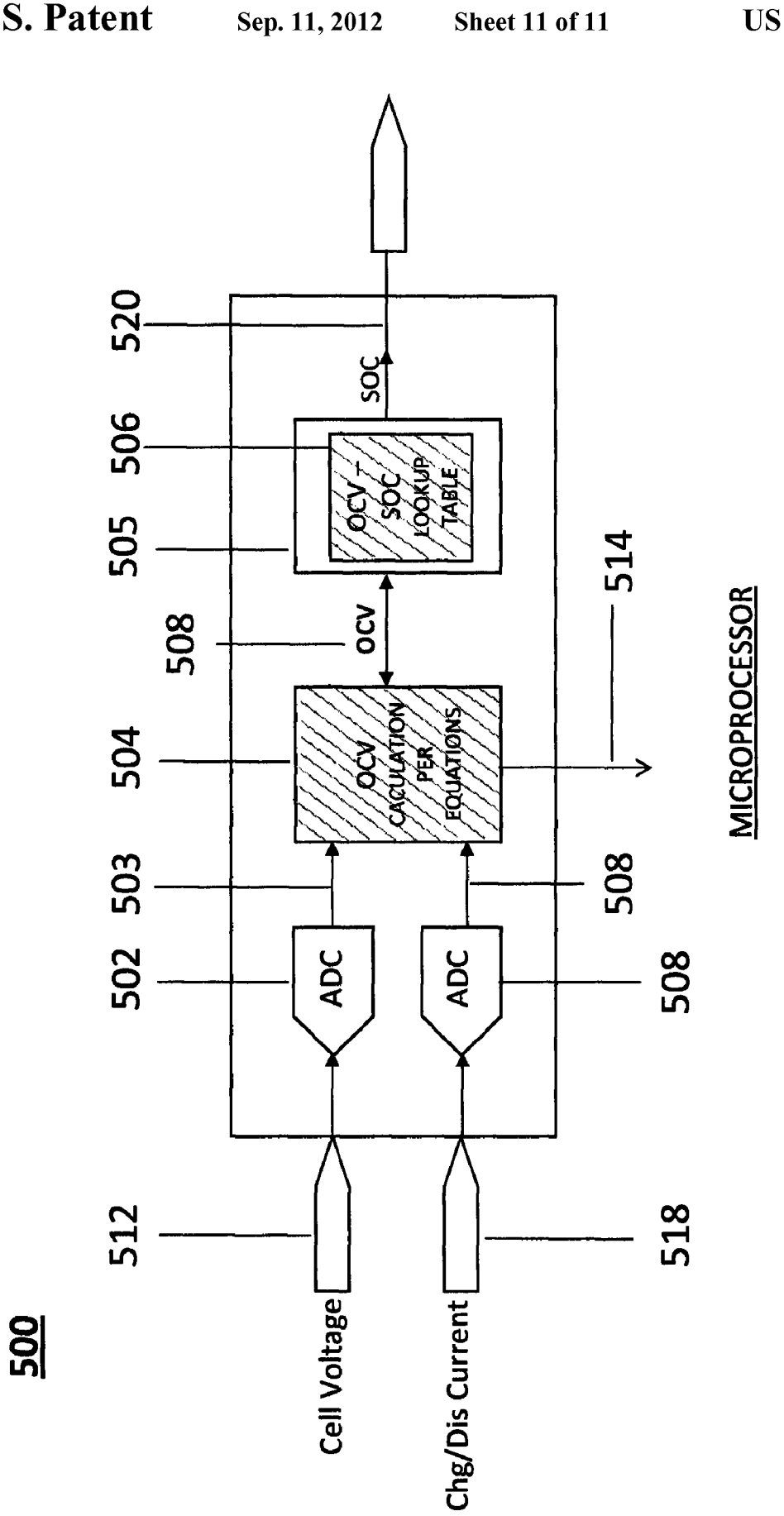
FIG. 5 illustrates a block diagram of an apparatus that estimates the state of charge of a battery consistent with some embodiments of the present invention.

FIG. 5 illustrates a block diagram of a processor 500 that computes the OCV, SOC, and ESR of a battery based on measurements of the terminal voltage ($V_{cell}$) 407 and current $I_{dis}$ 410 and $I_{chg}$ 415. In the embodiment shown in FIG. 5, microprocessor 500 includes analog to digital converters (ADC) 502 and 508. ADC 502 is electrically coupled to voltage sensor 414 (FIGS. 4a and 4b) to receive measurements of the terminal voltage ($V_{cell}$) 407 at terminal 512. ADC 502 provides a digitized terminal voltage measurement 503 to an interpolator equation calculator (IEC) 504. ADC 508 is electrically coupled to current sensor 408 (FIG. 4a) to receive current measurements of Idis 410 or $I_{chg}$ 415 at terminal 518. ADC 508 provides digitized current measurement values 507 to IEC 504. IEC 504 is electrically coupled to a memory 505 by input/output (I/O) bus 516. In some embodiments, memory 505 is internal memory (i.e., on the same die as the microprocessor) or external memory. In some embodiments, IEC 504 may have an output 514 for providing a calculated ESR value, an OCV value, or other parameters to a user. In various embodiments, the ESR determined while the battery is charging is used for calculations while the battery is discharging (Steps 466 and 482).

During a charging or a discharging stage, IEC 504 stores in memory 505 the plurality of digitized voltage and current measurements 503 and 507, respectively. During a discharging stage, IEC interpolates the plurality of voltage and current measurements (from Table 1) to obtain the equation of line 420 (FIG. 4c). In some embodiments, line 420 is of the form:

$$V_{cell} = OCV - I_{dis} * ESR \qquad (5)$$

IEC 504 calculates the slope and intercept of line 422 described by equation (5) and calculates the ESR and OCV. For example, utilizing measurements at time $t_1$ and $t_2$:

$$V_{cell\_1} = OCV - I_{dis\_1} * ESR \qquad (6)$$

measured at time $t_1$, and $$V_{cell\_2} = OCV - I_{dis\_2} * ESR \qquad (7)$$

measured at time $t_2$. Solving equations (5) and (6) for OCV and ESR yields:

$$OCV = \frac{V_{cell\_1} * I_{dis\_2} - V_{cell\_2} * I_{dis\_1}}{I_{dis\_2} - I_{dis\_1}} \qquad (8)$$

$$ESR = \frac{V_{cell\_1} - V_{cell\_2}}{I_{dis\_2} - I_{dis\_1}} \qquad (9)$$

Hence, two pairs of measured data points $V_{cell}$ and $I_{dis}$ from Table 1 provide a calculated value for OCV and ESR. Processor 504 can then average over the entirety of the data in order to determine best estimates for the parameters OCV and ESR. A line-fitting routine can be utilized to fit a line to the terminal voltage vs. current data (Step 472) shown in Table 1.

IEC 504 determines the SOC from the calculated OCV values, for example by utilizing look-up table 506 that is stored in memory 505 (Steps 478 and 488). Lookup table 506 contains information capable of determining the SOC of the battery from its stored OCV values by interpolating from the calculated OCV value. In some embodiments, lookup table 506 may contain pre-defined OCV and SOC values developed from laboratory measurements under controlled conditions typical of the battery chemistry. The SOC of the battery corresponding to the calculated OCV value determined from lookup table 506 is then provided as an output through output bus 520 (Steps 479 and 489). Output bus 520 can include a data bus, serial link, display, printer, and the like.

A similar calculation of OCV and ESR can be performed during the charging state (Steps 462-464). During a charging stage, IEC 504 interpolates the plurality of voltage and current measurements from table 2 to obtain the equation of line 422 (FIG. 4c). From Equation 4, line 422 may be of the form:

$$V_{cell} = OCV + I_{chg} * ESR \quad (10)$$

IEC 504 calculates the slope and intercept of line 422 described by Equation (10) and calculates the ESR and OCV. For example, utilizing measurements at time $t_1$ and $t_2$:

$$V_{cell\_1} = OCV + I_{chg\_1} * ESR, \text{ and} \quad (11)$$

$$V_{cell\_2} = OCV + I_{chg\_2} * ESR. \quad (12)$$

Solving equations 11 and 12 yields $$OCV = \frac{V_{cell\_1} * I_{chg\_2} - V_{cell\_2} * I_{chg\_1}}{I_{chg\_2} - I_{chg\_1}} \quad (13)$$

$$ESR = \frac{V_{cell\_1} - V_{cell\_2}}{I_{chg\_1} - I_{chg\_2}} \quad (14)$$

Utilizing all or part of the data in Table 2 in a line-fitting routine provides statistical averages for the calculated values of OCV and ESR based on the terminal voltage and current data.

IEC 504 utilizes lookup table 506 stored in memory 505 to obtain values of SOC from the determined values of OCV (Step 468). The SOC of the battery corresponding to the calculated OCV value is determined from lookup table 506 and is provided as an output by output means 520 (Step 469).

During both charge and discharge of the battery, sets of voltage and current values can be determined that are within a time frame where the SOC is not appreciably varied. In some embodiments of the present invention, a linear equation is extrapolated from a set of voltage and current values, a set comprising more than two pairs of voltage and current data points and having differing current values. As discussed above, in some embodiments of the present invention the OCV can be determined by the intercept on the voltage axis while a value of ESR can be determined from the slope of the extrapolation line. The SOC can then be determined based upon the OCV.

During battery charging, the system 400a is under the control of charging electronics and the charging current may be changed in order to observe the cell voltage. The charging current may be perturbed a few such times within a time frame during which the SOC does not significantly change in order to get a set of $I_{chg}$ and $V_{chg}$ points. Battery charging is further discussed in U.S. patent application Ser. No. 12/074,110, entitled "Battery Charger," which is herein incorporated by reference in its entirety. As discussed above in various embodiments of the present invention, the OCV can be determined based on a linear extrapolation of the $I_{chg}$ and $V_{chg}$ measurements, and the SOC is determined from the OCV. In some embodiments, the SOC is determined from the OCV using a lookup table.

During battery discharge, a practical load usually varies. Therefore, cell voltage ($V_{dis}$) can be measured with varying current values as a result of the load variation. Again in some embodiments, the OCV and the SOC can be calculated based upon the linear extrapolation from the current and voltage values, as described above.

For some embodiments of the present invention where charging is controllable, one may measure the SOC in such manner during a charging process as described above and the ESR of the cell determined in addition to the OCV. ESR is the slope of the fitted current-voltage line 422. The same ESR may be used for the discharge process (Steps 466 and 482) and an OCV can be determined based on a single data point and without any fitting, by utilizing a rearranged version of equation (3) (Steps 484-488):

$$OCV = V_{dis} + I_{dis} * ESR \quad (15)$$

Such an approximate method is very powerful for determining the SOC during discharge when the battery has a fairly constant load.

This SOC determination using the current-voltage (I-V) line slope-intercept method is applicable at least to general battery systems where kinetic and transport polarizations are minimal or predictable. Kinetic polarization is seen as the non-linear behavior of the I-V curve at low currents. Transport polarization is seen as the non-linear behavior at high currents. Flow batteries consistent with some embodiments of the present invention have minimal kinetic and transport polarization and therefore have linear and predictable I-V relationships.

For most well-designed flow battery systems, the charge and discharge ESRs are the same or similar. A well-designed flow battery system includes fast, reversible reactions and sufficient flow to the battery stack. Hence, the ESR calculated for the charging process can be used during discharging and vice-versa. However, experimentally and empirically, any deviations can be measured for a given flow battery and ESRs may be calibrated if necessary.

Other embodiments will be apparent to those skilled in the art from consideration of the specification and practice disclosed herein. It is intended that the specification and examples be considered as exemplary only, with a true scope and spirit of the invention being indicated by the following claims.

What is claimed is:

1. A method of determining a state of a battery, comprising:
    measuring a terminal voltage across the battery using a voltage sensor and measuring a current flowing through the battery using a current sensor at a plurality of different times to obtain terminal voltage and current data;
    fitting a line equation with a slope and an intercept to the terminal voltage and current data using a microprocessor; and
    calculating from the intercept of the linear equation an open-circuit voltage (OCV) of the battery using the microprocessor.

2. The method of claim 1, further including:
    determining a state-of-charge (SOC) of the battery from the OCV using the microprocessor.

3. The method of claim 2, wherein determining the SOC includes:
referencing a look-up table based on the OCV using the microprocessor.

4. The method of claim 1, wherein the battery is a flow battery.

5. The method of claim 1, wherein measuring the terminal voltage and the current includes:
altering a charging current while charging the battery; and
measuring the terminal voltage at the charging current.

6. The method of claim 1, wherein measuring the terminal voltage and the current includes:
measuring the terminal voltage as a load current varies during discharge, using the microprocessor.

7. The method of claim 5, further including:
determining an equivalent series resistance (ESR) from the slope, using the microprocessor; and
utilizing the ESR during discharge to determine the OCV from a single measurement of the terminal voltage at a discharge current, using the microprocessor.

8. A method for calculating a state of charge (SOC) of a battery, comprising the steps of:
measuring a terminal voltage across the battery using a voltage sensor and measuring a current flowing through the battery system using a current sensor at a plurality of different times;
determining, using a microprocessor, a linear equation that describes a relationship between the terminal voltage and the current;
calculating, using the microprocessor, an open-circuit voltage (OCV) from the linear equation; and
determining the SOC of the battery using the calculated OCV using the microprocessor.

9. The method of claim 8 wherein the state-of-charge of the battery is determined from the OCV by reference to a look-up table using the microprocessor.

10. The method of claim 9, further including:
calculating an equivalent series resistance for the battery from the slope of the linear equation, using the microprocessor.

11. The method of claim 8, wherein measuring the terminal voltage and the current includes:
varying a charging current during charging;
measuring the charging current at a plurality of different times; and
determining the terminal voltage for each of the measured charging currents.

12. The method of claim 11, further including:
calculating an equivalent series resistance (ESR) from the slope, using the microprocessor.

13. The method of claim 12, further including:
determining the OCV based on a single measurement of terminal voltage and discharge current, using the microprocessor.

14. An apparatus for determining a state of charge (SOC) of a battery, comprising:
a current sensor electrically coupled to the battery determine a current value related to a current through the battery at a plurality of times;
a voltage sensor electrically coupled to the battery to determine a terminal voltage value related to a terminal voltage across the battery at the plurality of times;
a first analog to digital converter (ADC) electrically coupled to the voltage sensor to receive the terminal voltage value and to provide a digitized voltage value;
a second analog to digital converter (ADC) electrically coupled to the current sensor to receive the current value and provide a digitized current value; and
an interpolator equation calculator (IEC) electrically coupled to the first ADC and to the second ADC to receive the digitized voltage value and the digitized current value for each of the plurality of times, the IEC determining a line equation that best fits the digitized voltage value and digitized current value at the plurality of times and determining an open-circuit voltage for the battery based on an intercept of the line equation.

15. The apparatus of claim 14, further including:
a memory where the IEC stores the digitized voltage value and the digitized current value for each of the plurality of times.

16. The apparatus of claim 15, further including:
a stored look-up table and wherein the IEC determines the open-circuit voltage by interpolating from the stored look-up table.

17. The apparatus of claim 14, wherein the IEC determines the equivalent resistance of the battery from a slope of the line equation.

18. The apparatus of claim 14, wherein the first ADC and the second ADC comprise a single ADC configured to digitize both voltage and current measurements.

19. The apparatus of claim 14 wherein the battery is a flow battery.

* * * * *